(12) United States Patent  
Alabduljabbar et al.

(10) Patent No.: US 9,310,138 B2  
(45) Date of Patent: Apr. 12, 2016

(54) COOLING SYSTEM FOR HIGH PERFORMANCE SOLAR CONCENTRATORS

(75) Inventors: Ayman Alabduljabbar, Riyadh (SA); Abdullah I. Alboiez, Riyadh (SA); Yaseen G. Alharbi, Riyadh (SA); Alhassan Badahdah, Riyadh (SA); Hussam Khonkar, Riyadh (SA); Yves C. Martin, Ossining, NY (US); Naim Moumen, Walden, NY (US); Robert L. Sandstrom, Chestnut Ridge, NY (US); Theodore Gerard van Kessel, Millbrook, NY (US)

(73) Assignees: International Business Machines Corporation, Armonk, NY (US); King Abdulaziz City for Science and Technology, Riyadh (SA)

( * ) Notice: Subject to any disclaimer, the term of this patent is extended or adjusted under 35 U.S.C. 154(b) by 136 days.

(21) Appl. No.: 13/613,987

(22) Filed: Sep. 13, 2012

(65) Prior Publication Data

US 2014/0069501 A1    Mar. 13, 2014

(51) Int. Cl.
*H01L 31/024* (2014.01)
*F28D 15/02* (2006.01)
(Continued)

(52) U.S. Cl.
CPC . *F28D 15/02* (2013.01); *F24J 2/32* (2013.01); *H01L 23/367* (2013.01);
(Continued)

(58) Field of Classification Search
CPC ....... H01L 23/34; H01L 23/36; H01L 23/367; H01L 23/3675; H01L 23/052–23/0524; H01L 31/052–31/0524; H01L 31/0543; F28D 2015/02–2015/0216; F28D 15/02; F28D 2021/0028; F28D 2021/0029; F24J 2/32; F24J 2/08; F24J 2/542; H05K 7/20336; Y02E 10/52
USPC .......... 136/243–265; 165/80.3, 104.33, 165/104.26; 361/679.47–679.49, 679.53, 361/699–706, 709, 710, 679.52; 257/714, 257/715
See application file for complete search history.

(56) References Cited

U.S. PATENT DOCUMENTS 4,375,897 A    3/1983 Takada  
5,113,659 A    5/1992 Baker et al.

(Continued)

FOREIGN PATENT DOCUMENTS

WO    WO2011076107 A1    6/2011

OTHER PUBLICATIONS techPowerUp, "Thermal Paste and How to Use It." Published online Jan. 8, 2006 at http://www.techpowerup.com/articles/overclocking/134.*

(Continued)

*Primary Examiner* — James Lin  
*Assistant Examiner* — Liesl C Baumann  
(74) *Attorney, Agent, or Firm* — Vazken Alexanian; Michael J. Chang, LLC

(57) ABSTRACT

Techniques for cooling concentrating solar collector systems are provided. In one aspect, an apparatus for cooling a photovoltaic cell includes a heat exchanger having a metal plate with a bend therein that positions a first surface of the metal plate at an angle of from about 100 degrees to about 150 degrees relative to a second surface of the metal plate, and a plurality of fins attached to a side of the metal plate opposite the first surface and the second surface; a vapor chamber extending along the first surface and the second surface of the metal plate, crossing the bend; and a cladding material between the vapor chamber and the heat exchanger, wherein the cladding material is configured to thermally couple the vapor chamber to the heat exchanger. A photovoltaic system and method for operating a photovoltaic system are also provided.

14 Claims, 5 Drawing Sheets

(51) Int. Cl.
*F24J 2/32* (2006.01)
*H01L 23/367* (2006.01)
*H01L 31/052* (2014.01)
*H01L 31/054* (2014.01)
*F28D 21/00* (2006.01)
*F24J 2/08* (2006.01)
*F24J 2/54* (2006.01)

(52) U.S. Cl.
CPC ......... *H01L 31/052* (2013.01); *H01L 31/0543* (2014.12); *F24J 2/08* (2013.01); *F24J 2/542* (2013.01); *F28D 2015/0216* (2013.01); *F28D 2021/0028* (2013.01); *F28D 2021/0029* (2013.01); *Y02E 10/52* (2013.01)

(56) References Cited

U.S. PATENT DOCUMENTS

| | | | |
|---|---|---|---|
| 5,660,644 A | 8/1997 | Clemens | |
| 6,020,554 A | 2/2000 | Kaminar et al. | |
| 6,816,373 B2 * | 11/2004 | Lee et al. | 361/697 |
| 6,999,312 B1 * | 2/2006 | Garnett et al. | 361/679.54 |
| 7,277,282 B2 * | 10/2007 | Tate | 361/697 |
| 7,339,108 B2 | 3/2008 | Tur et al. | |
| 7,342,788 B2 * | 3/2008 | Nikfar | 361/700 |
| 7,552,759 B2 * | 6/2009 | Liu et al. | 165/104.26 |
| 7,557,290 B2 | 7/2009 | Schripsema et al. | |
| 7,665,511 B2 * | 2/2010 | Bhatti et al. | 165/104.33 |
| 7,807,920 B2 * | 10/2010 | Linke et al. | 136/246 |
| 7,855,336 B2 * | 12/2010 | Linke | 136/246 |
| 2006/0243431 A1 | 11/2006 | Martin et al. | |
| 2006/0278370 A1 * | 12/2006 | Rockenfeller et al. | 165/104.33 |
| 2007/0169919 A1 * | 7/2007 | Deng et al. | 165/104.33 |
| 2009/0056786 A1 | 3/2009 | Johnson et al. | |
| 2009/0151898 A1 * | 6/2009 | Lai et al. | 165/80.3 |
| 2009/0223553 A1 | 9/2009 | Thoroughgood | |
| 2009/0277496 A1 | 11/2009 | Khazeni et al. | |
| 2010/0078061 A1 * | 4/2010 | Lu et al. | 136/246 |
| 2010/0091495 A1 * | 4/2010 | Patrick | 362/249.02 |
| 2011/0090649 A1 * | 4/2011 | Chan et al. | 361/709 |
| 2011/0120539 A1 * | 5/2011 | Minano et al. | 136/255 |
| 2012/0247538 A1 | 10/2012 | Zhao et al. | |

OTHER PUBLICATIONS

Y. Zhangbo et al., "The cooling technology of solar cells under concentrated system," IEEE 6th International IPEMC '09, May 17-20, 2009, pp. 2193-2197.

W. G. Anderson et al., "Heat Pipe Cooling of Concentrating Photovoltaic Cells." ACT, Inc. DOE Phase 1 SBIR program, Grant DE-FG02-07ER84847, 2008.

A. Plesniak et al., "Demonstration of High-Performance Concentrating Photovoltaic Module Designs for Utility-Scale Power Generation," ICEPAG 2009, Feb. 11, 2009.

* cited by examiner

CONCENTRATING SOLAR COLLECTOR

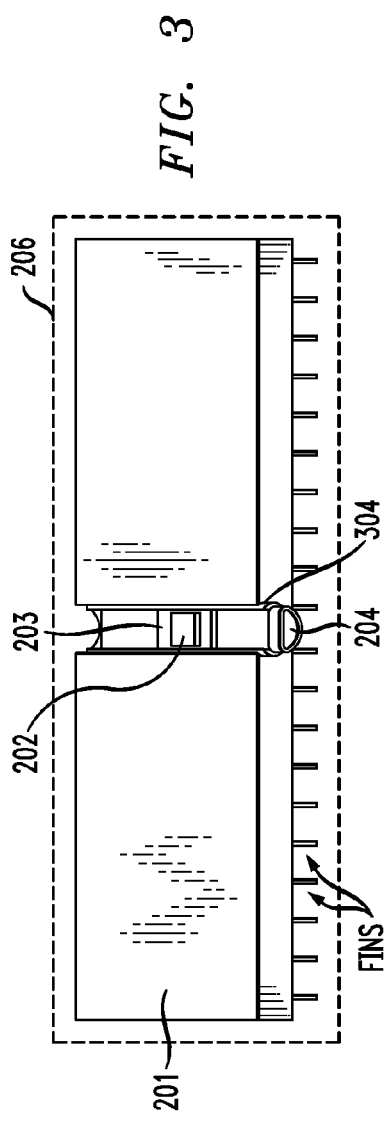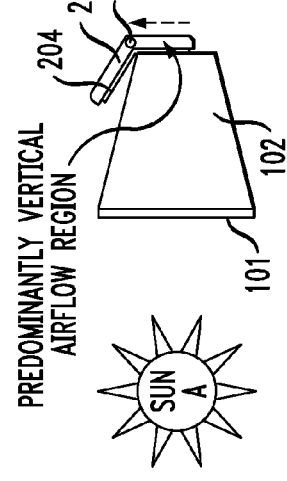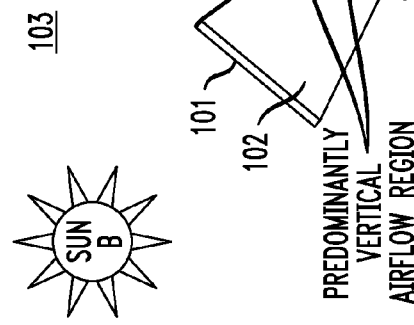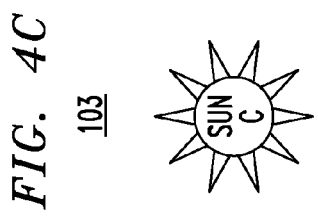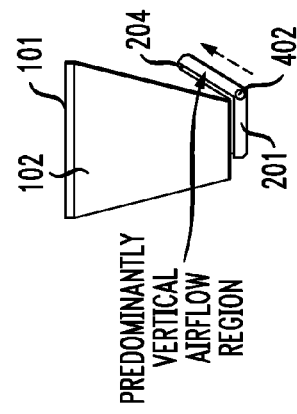

COOLING SYSTEM FOR HIGH PERFORMANCE SOLAR CONCENTRATORS

FIELD OF THE INVENTION

The present invention relates to concentrating solar collectors and more particularly, to techniques for cooling concentrating solar collector systems.

BACKGROUND OF THE INVENTION

Concentrating solar collectors operating at extreme concentrations (from about 500 suns to about 2,000 suns) require optimal cooling systems to dissipate heat that evolves in the photovoltaic cell from incident solar radiation. A variety of cooling methods are available including liquid cooling, forced air and convective cooling. Of these methods, convective cooling is often viewed as the most desirable for cost and reliability reasons.

A common strategy to implement high performance collection is to construct an array of concentrating solar collectors (Fresnel lenses for example). In such an array, each lens is associated with a given photovoltaic cell. In conventional designs, these photovoltaic cells must be individually packaged, structurally supported and cooled. These elements are structurally connected and move as a single unit to track the sun on a single two axis drive system. It is normal practice to electrically connect individual photovoltaic cells in series to enable system operation at higher voltage. In systems comprising many photovoltaic cells, this voltage is large and electrical isolation of components is necessary for safety and reliability.

Concentrating solar collector systems track the sun in order to maintain optical focus of the concentrated sunlight on the photovoltaic cells. In typical designs, the tracking must be accurate to angles of a degree or less relative to the sun. Tracking may be performed by rotating the assembly in the azimuth and then the elevation to follow the sun.

A cooling system affixed to a photovoltaic cell on a concentrating solar collector will therefore experience angular rotations ranging as much as from zero degrees to 90 degrees in elevation over the course of the solar day depending on the day of the year and geographic location. It is desirable that the cooling system operate optimally over this range of angles.

Therefore, techniques for cooling concentrating solar collector systems that perform optimally at different elevation angles and provide electrical isolation to the photovoltaic cells in the system would be desirable.

SUMMARY OF THE INVENTION

The present invention provides techniques for cooling concentrating solar collector systems. In one aspect of the invention, an apparatus for cooling a photovoltaic cell is provided. The apparatus includes a heat exchanger comprising a metal plate with a bend therein that positions a first surface of the metal plate at an angle of from about 100 degrees to about 150 degrees relative to a second surface of the metal plate, and a plurality of fins attached to a side of the metal plate opposite the first surface and the second surface; a vapor chamber extending along the first surface and the second surface of the metal plate, crossing the bend, such that during operation when the photovoltaic cell is attached to either the first surface or the second surface of the metal plate the vapor chamber is positioned to transport heat away from the photovoltaic cell; and a cladding material between the vapor chamber and the heat exchanger, wherein the cladding material is configured to thermally couple the vapor chamber to the heat exchanger.

In another aspect of the invention, a photovoltaic system is provided. The photovoltaic system includes a cooling apparatus having a heat exchanger having a metal plate with a bend therein that positions a first surface of the metal plate at an angle of from about 100 degrees to about 150 degrees relative to a second surface of the metal plate, and a plurality of fins attached to a side of the metal plate opposite the first surface and the second surface; a vapor chamber extending along the first surface and the second surface of the metal plate, crossing the bend; a cladding material between the vapor chamber and the heat exchanger, wherein the cladding material is configured to thermally couple the vapor chamber to the heat exchanger. The photovoltaic system further includes at least one photovoltaic cell thermally coupled to the vapor chamber; and a concentrating solar collector attached to either the first surface or the second surface of the metal plate and surrounding the photovoltaic cell.

In yet another aspect of the invention, a method for operating a photovoltaic system is provided. The method includes the following steps. A photovoltaic system is provided. The photovoltaic system includes a cooling apparatus. The cooling apparatus includes a heat exchanger having a metal plate with a bend therein that positions a first surface of the metal plate at an angle of from about 100 degrees to about 150 degrees relative to a second surface of the metal plate, and a plurality of fins attached to a side of the metal plate opposite the first surface and the second surface, a vapor chamber extending along the first surface and the second surface of the metal plate, crossing the bend, and a cladding material between the vapor chamber and the heat exchanger, wherein the cladding material is configured to thermally couple the vapor chamber to the heat exchanger. The photovoltaic system also includes at least one photovoltaic cell thermally coupled to the vapor chamber and a concentrating solar collector attached to either the first surface or the second surface of the metal plate and surrounding the photovoltaic cell. The photovoltaic system is rotated to place the photovoltaic cell at a plurality of positions relative to a light source.

A more complete understanding of the present invention, as well as further features and advantages of the present invention, will be obtained by reference to the following detailed description and drawings.

BRIEF DESCRIPTION OF THE DRAWINGS

FIG. 3 is a diagram illustrating an enlarged view of a portion of the cooling system of FIG. 2 according to an embodiment of the present invention;

FIG. 4A is a diagram illustrating one exemplary positioning of the cooling system of FIG. 1 and how at least one portion of the cooling apparatus is in a substantially vertical orientation according to an embodiment of the present invention;

FIG. 4B is a diagram illustrating another exemplary positioning of the cooling system of FIG. 1 and how at least one portion of the cooling apparatus is in a substantially vertical orientation according to an embodiment of the present invention;

Figure 1:
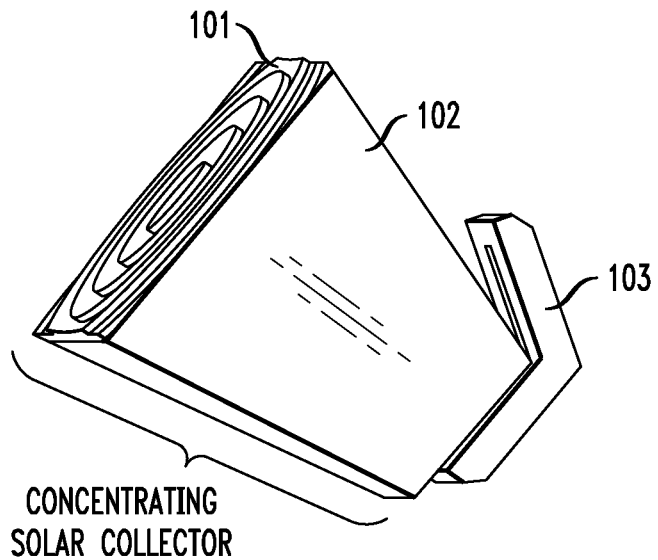
FIG. 1 is a diagram illustrating a concentrating solar collector with a high power cooling system attached thereto according to an embodiment of the present invention.
Figure 5A:
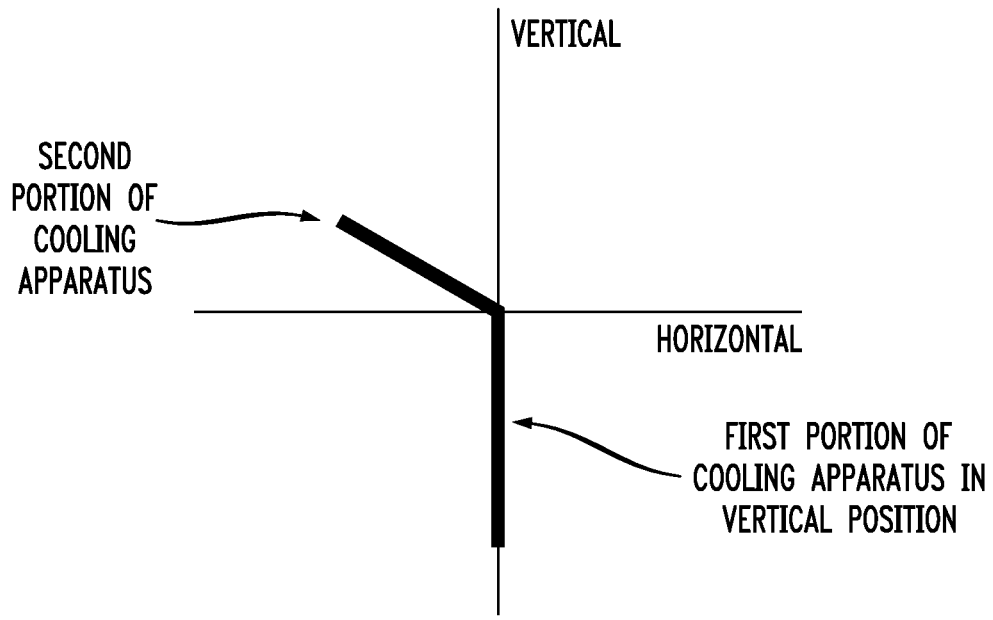
Figure 5B:
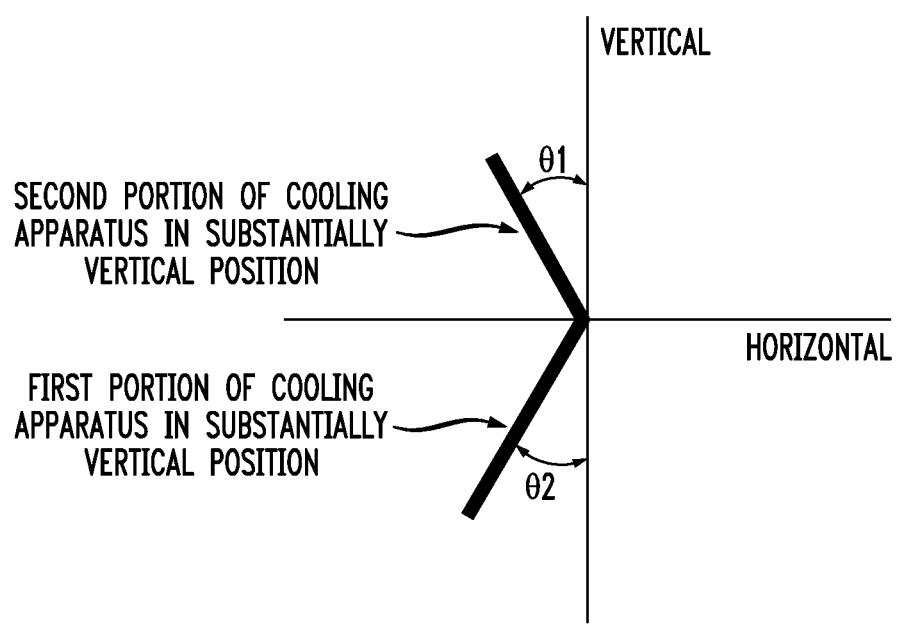
Figure 5C:
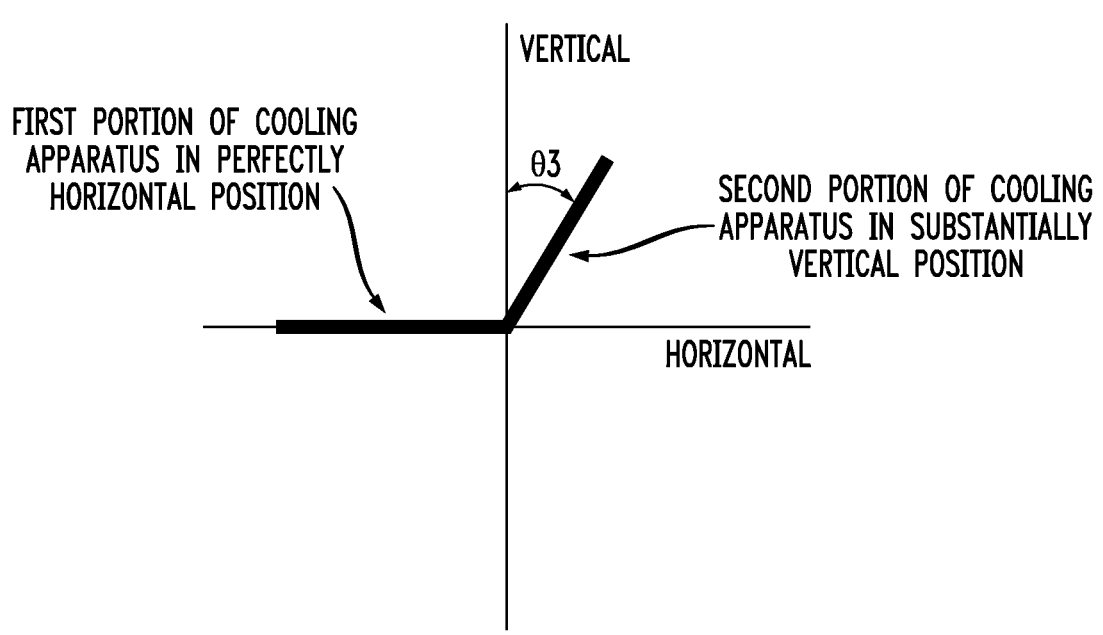
Figure 6:
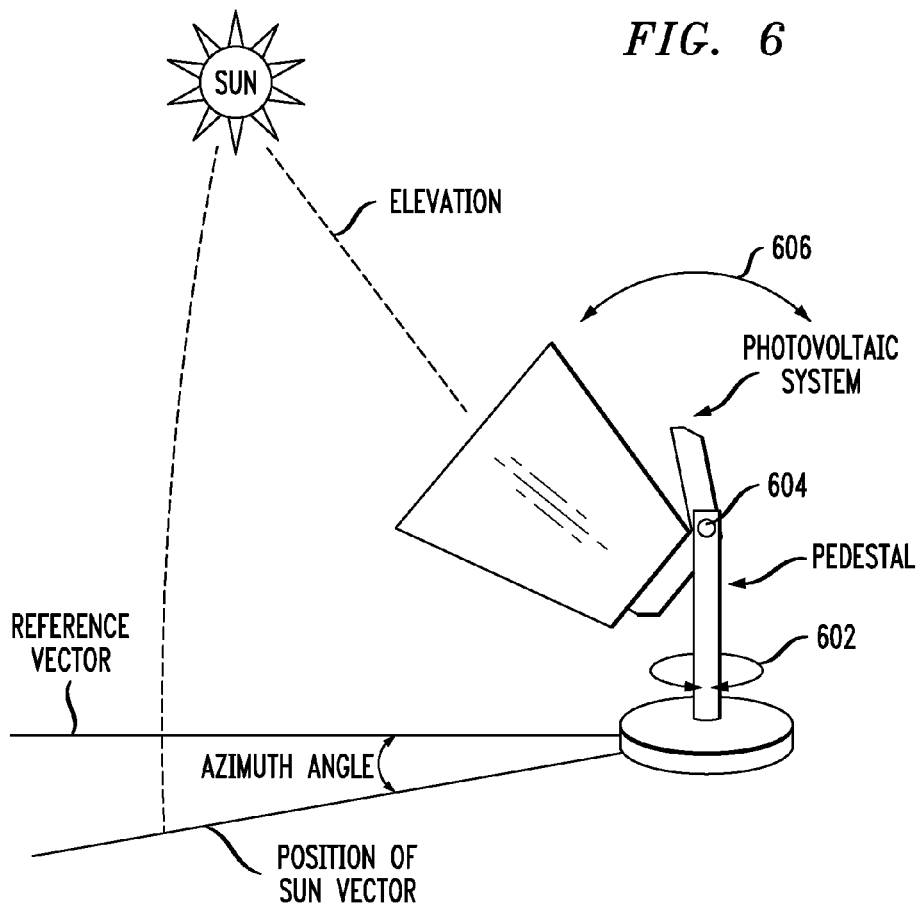
Figure 7:
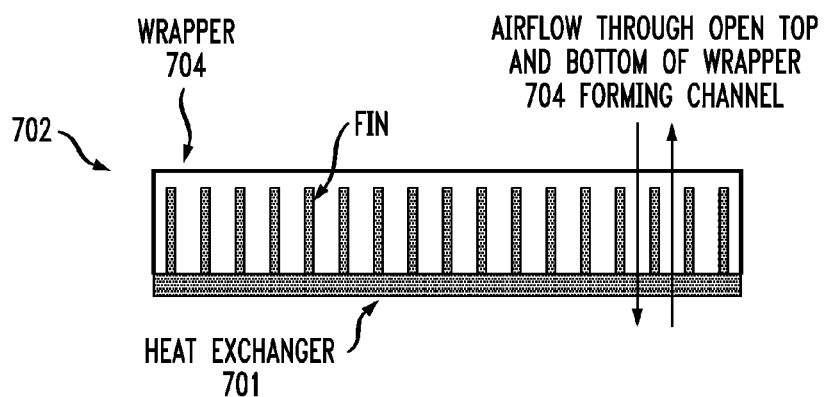

4C is a diagram illustrating yet another exemplary positioning of the cooling system of FIG. 1 and how at least one portion of the cooling apparatus is in a substantially vertical orientation according to an embodiment of the present invention;

FIG. 5A graphically depicts the positioning of the cooling apparatus in FIG. 4A and illustrates how a first portion of the cooling apparatus is in a vertical position according to an embodiment of the present invention;

FIG. 5B graphically depicts the positioning of the cooling apparatus in FIG. 4B and illustrates how both a first portion and a second portion of the cooling apparatus are in a vertical position according to an embodiment of the present invention;

FIG. 5C graphically depicts the positioning of the cooling apparatus in FIG. 4C and illustrates how a second portion of the cooling apparatus is in a vertical position according to an embodiment of the present invention;

FIG. 6 is a diagram illustrating an exemplary two-axis drive system being used in conjunction with the present photovoltaic system according to an embodiment of the present invention; and FIG. 7 is a diagram illustrating an enlarged view of a portion of the present plate fin heat exchanger that highlights a plate and fins attached thereto as well as an optional wrapper that caps the fins to constrain air flow along the fin assembly according to an embodiment of the present invention.

DETAILED DESCRIPTION OF PREFERRED EMBODIMENTS

Provided herein are techniques for cooling high performance concentrating solar collectors in photovoltaic systems that operate optimally at different elevation angles and provide electrical isolation to the photovoltaic cells in the system. FIG. 1, for example, is a diagram illustrating a photovoltaic system that includes a concentrating solar collector with a high power cooling apparatus 103 attached thereto. Cooling apparatus 103 is capable of operation at high solar concentrations (i.e., at greater than 50 Watts per square centimeter ($W/cm^2$)). The concentrating solar collector includes a collector optic 101 (i.e., a lens) and an enclosure support 102. The concentrating solar collector is attached to the high power cooling apparatus 103 using, e.g., mechanical means such as fasteners (e.g., screws) or by way of an adhesive.

The concentrating solar collector may be used individually (as shown in FIG. 1) or in an array, and may be attached to a two-axis drive system. A two-axis drive system (azimuth and elevation) would allow the photovoltaic system to be pointed in two dimensions to follow the sun. Telescopes employ similar two-axis drive systems to track stars. An example of a two-axis drive system suitable for use with the present photovoltaic system is shown in FIG. 5, described below.

As will be described in detail below, cooling apparatus 103 (to which a photovoltaic cell is attached) includes a bent fin convective heat exchanger coupled to an electrically isolated heat pipe (or vapor chamber) that is directly coupled to the photovoltaic cell using a metal thermal interface. An exemplary configuration of cooling apparatus 103 is depicted in detail in FIG. 2, described below.

During operation of the photovoltaic system, light energy (from the sun) is focused on the photovoltaic cell by the concentrating solar collector. The photovoltaic cell will convert (a portion) of the light energy into electricity. However, the photovoltaic cell is in most cases not 100% efficient. Therefore, an un-used portion of the light energy has to be carried away from the photovoltaic cell (in the form of heat).

Thus, the light energy from the sun is a source of heat (heat source) to the photovoltaic system. By way of the cooling apparatus 103, this heat is carried away from the photovoltaic cell. See description below.

Figure 2:
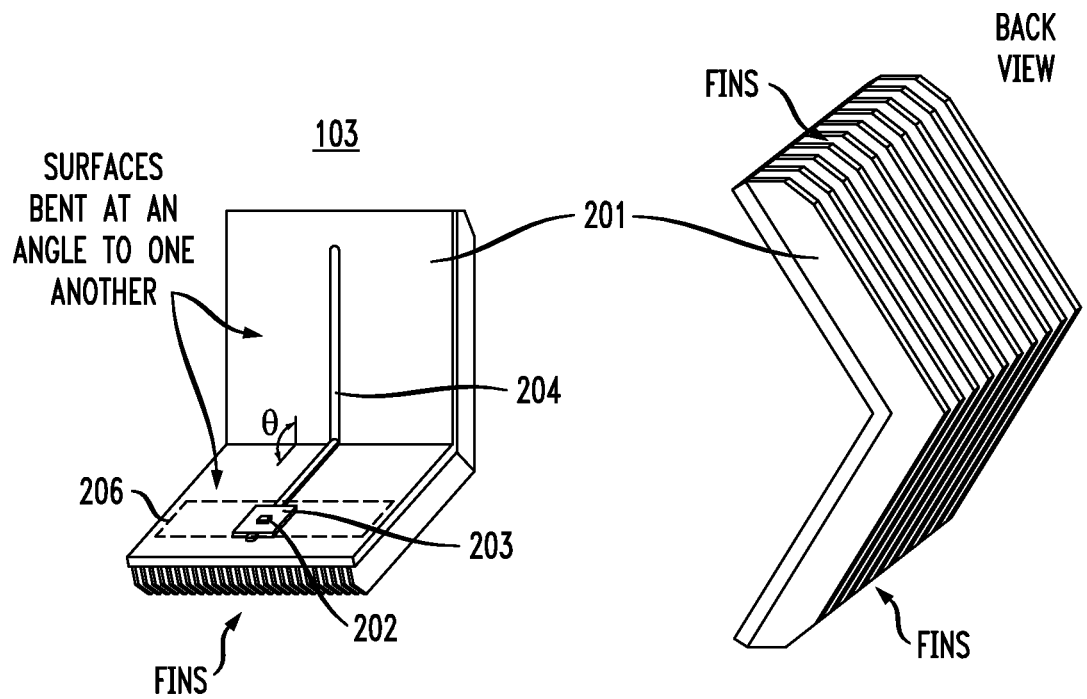
FIG. 2 is a diagram illustrating one exemplary configuration of the cooling system of FIG. 1 according to an embodiment of the present invention.

FIG. 2 is a diagram illustrating one exemplary configuration of cooling apparatus 103 (of FIG. 1). In this example, cooling apparatus 103 includes a bent fin naturally convective heat exchanger 201 thermally coupled to an electrical insulation-clad vapor chamber 204 (in the example shown in FIG. 2, and elsewhere herein, the vapor chamber 204 is a heat pipe, however any other type of vapor chamber configuration may be employed in the same manner) (that is electrically, but not thermally isolated, from the heat exchanger by the electrical insulation) which in turn is thermally coupled to a thermal spreader plate 203 (either directly or through a thermal interface material (suitable thermal interface materials are provided below)) and photovoltaic cell 202. The use of a thermal spreader plate is optional, as photovoltaic cell 202 may alternatively be directly attached to the vapor chamber 204 (by way of a thermal interface material, see below) or to an intermediate substrate (also by way of a thermal interface material). It is further noted that the photovoltaic cell 202 may be thermally coupled to the heat pipe through a conductive substrate that comprises a conductive pattern layer on a thermally conductive substrate with appropriate thermal interfacing. This allows direct and convenient electrical connection to the cell.

As described above, the cooling apparatus serves to remove heat from the photovoltaic cell. As explained above, the heat source (during operation) is the light energy from the sun incident on the photovoltaic device, a portion of which needs to be carried away from the photovoltaic cell as heat. The heat flow through the exemplary configuration shown in FIG. 2 is now described. The heat from the photovoltaic cell enters the vapor chamber 204. A heat pipe is an extremely efficient heat spreader. The bent fin heat exchanger 201 (thermally coupled to the vapor chamber 204) then convects the heat from the vapor chamber 204 into the air. The vapor chamber 204 permits the heat to be spread over the whole bent fin heat exchanger 201, thus allowing for more effective cooling by apparatus 103.

As provided above, the bent fin heat exchanger 201 is a naturally convective heat exchanger. A naturally convective heat exchanger relies on the buoyancy change of air to convect heat into the air (which occurs as a result of placing a hot object in air). By way of example only, natural convection is how baseboard heaters heat a dwelling.

Photovoltaic cell 202 can be a triple-junction solar photovoltaic converter cell for high efficiency or a single semiconductor photovoltaic cell (e.g., a silicon solar cell optimized for high light concentration). This optimization includes but is not limited to doping and enlarging the grid, as is known in the art, for improved series resistance given the higher current resulting from light concentration. Triple junction solar converter cells and single semiconductor photovoltaic cells are known to those of skill in the art and thus are not described further herein.

According to an exemplary embodiment, heat exchanger 201 is a plate fin heat exchanger, made of a suitable metal (such as, copper, brass, steel and/or aluminum), wherein the fins are attached to one side of the plate, as shown in FIG. 2. As also shown in FIG. 2, the plate fin heat exchanger 201 has a bend therein that positions one surface thereof (i.e., a first surface) at an angle θ relative to another surface thereof (i.e., a second surface). In one exemplary configuration, the bend positions the first surface of the plate fin heat exchanger at an included angle θ of from about 100 degrees to about 150 degrees, e.g., at an angle of about 140 degrees, relative to the second surface of the plate fin heat exchanger. In most embodiments this bend is not large. A back view of the heat exchanger is also provided in FIG. 2 to illustrate that, according to an exemplary embodiment, the fins are attached to a back of the plate.

As shown in FIG. 2, the vapor chamber 204 extends along the first and second surfaces of the plate fin heat exchanger crossing the bend therein. As will be described in detail below, this particular configuration permits, during operation, at least one of the surfaces of the plate fin heat exchanger (and consequently a portion(s) of the vapor chamber) to always be in a substantially vertical orientation when the heat exchanger is rotated to place the photovoltaic cell at a good position to capture light from a light source (i.e., the sun). Air tends to rise up in a vertical direction. Thus, since the plate fin heat exchanger is a naturally convective heat exchanger (see above), then it is beneficial for at least a portion of the plate fin heat exchanger to be in a substantially vertical orientation during operation to enhance convection of heat from the plate fin heat exchanger to the air. Of course, the plate fin heat exchanger will operate (naturally convect heat to the air) even if the plate fin heat exchanger is not in a substantially vertical orientation. However, the efficiency at which it operates will be diminished.

The embodiments configured as shown in FIG. 2 particularly benefit from the azimuth elevation tracking (see FIG. 6, described below) in that the fins are always in a plane that includes the surface normal to the earth. The elevation angle is shown in FIG. 6. It is noted that the embodiment is still practical in alternate drive strategies such as elevation azimuth. Though elevation azimuth is not optimal, as long as a vertical flow component is possible, improved cooling will result. Additionally, the fins may be optionally covered with a metal or plastic wrapper that forms a convective airflow channel containing the fins. See FIG. 7, described below. Alternately, the fins may be slotted to allow some cross flow of air.

Photovoltaic cells used for solar concentrators are typically constrained to operation at or below from about 85 degrees Celsius (° C.) to about 110° C. for both efficiency and lifetime considerations (lifetime expectations for solar systems are on the order of 20 to 30 years). Operation is desired in a range of climates, including desert climates where ambient temperatures up to 45° C. can occur. Therefore, in the case of a desert climate the thermal budget for a cooling system is 40° C. At an incident power of 200 W/cm$^2$ and an operating power of 60 watts (W), the overall cooling system performance requirement is 0.30° C./W. This performance requirement constrains the elements of the cooling system to the high performance category (such as those described herein which are capable of operation at high solar concentrations, i.e., at greater than 50 W/cm$^2$). For less concentrated systems, for example, in the 500 sun range, system performance in the 1.2° C./W is acceptable.

Vapor chambers, such as heat pipes (a heat pipe is a kind of vapor chamber), and the functioning thereof are known to those of skill in the art. In general however vapor chambers cool by way of an enclosed working fluid (e.g., water) that serves to carry heat away from a heat source by vaporization. The fluid recondenses in other cooler areas of the vapor chamber. A wick delivers the fluid back to the location of the heat source. While the substantially cylindrical shape of a heat pipe makes it convenient for the present techniques, if desired either a heat pipe or a vapor chamber may be used interchangeably in any of the embodiments presented herein.

Advantageously, this configuration enables the use of a thermal interface material, such as solder, a liquid metal thermal interface or a conductive particle filled organic paste or gel (not visible in this depiction), that directly thermally connects the photovoltaic cell to the spreader plate, the heat pipe/vapor chamber or an intermediate substrate while providing electrical isolation (by way of the electrical insulation around the heat pipe) to the photovoltaic element. That way, maximum heat transfer from the photovoltaic cell to the cooling system can occur. Further, given the shape of bent fin naturally convective heat exchanger 201, maximum cooling performance can be attained at a range of operating angles. An enlarged view of portion 206 of cooling apparatus 103 is shown in FIG. 3.

FIG. 3 is a diagram illustrating an enlarged view of portion 206 (of FIG. 2). As shown in FIG. 3, and as described above, photovoltaic cell 202 is thermally coupled to thermal spreader plate 203. Thermal spreader plate 203 is thermally coupled to vapor chamber 204. In this particular, preferred embodiment, vapor chamber 204 is clad in a thermally conductive but electrically insulating cladding material 304. The cladding material 304 thermally connects the vapor chamber 204 to the heat sink 201. Cladding material 304 can be made of a plastic, a ceramic and/or a glass material. As highlighted above, this configuration enables the use of a thermal interface material, such as a solder, a liquid metal thermal interface (such as a liquid metal alloy), thermal grease, a conductive particle filled organic thermal paste or gel (e.g., a particle impregnated polymer) and/or a phase change material that directly connects the photovoltaic cell to the thermal spreader plate while providing electrical isolation to the photovoltaic cell.

As highlighted above, the use of a thermal spreader plate is optional and embodiments are presented herein (not shown) where the photovoltaic cell is directly thermally attached to the heat pipe (by way of a thermal interface material). By way of example only, the photovoltaic cell can be soldered directly to the heat pipe. Alternatively, the photovoltaic cell can be attached to an intermediate substrate (not shown) which is in turn thermally attached to thermal spreader plate 203 (again by way of a thermal interface material). The intermediate substrate can include a metalized intermediate substrate of electrically insulating but thermally conductive material, such as aluminum nitride or aluminum oxide which is bonded to the thermal spreader plate surface. In yet another variation, the photovoltaic cell can be attached to an intermediate substrate (not shown) which is in turn directly thermally attached to the heat pipe (again by way of a thermal interface material).

Introducing intermediate elements between the photovoltaic cell and the heat pipe, such as a thermal spreader plate and/or an intermediate substrate allows the engineer to introduce electrical isolation, mechanical strain relief, part handling capability, mechanical stability and thermal expansion matching. However, these elements are introduced at a thermal cost and must be factored into the desired system performance to select the optimal embodiment for a given concentrator system.

In one embodiment, the vapor chamber comprises all or part of the mechanical structural support of the photovoltaic cell. For example, if the photovoltaic cell is attached directly to the vapor chamber using a solder thermal interface, the assembly becomes a solid unit that can be added or removed from the system as a module and affixed using screws between the module and the heat sink. The system has been illustrated herein as a single lens concentrating light on a single cell and heat sink for simplicity. It is noted however that the bent fin may be practiced for arrays of lenses and cells.

It is notable that a naturally convective heat exchanger such as bent fin naturally convective heat exchanger 201 (of FIG. 2) operates optimally in an orientation that allows rising convective air currents to move parallel to cooling fin surfaces. Heat pipes and vapor chambers operate optimally in a substantially vertical orientation with the heat producing element (in this case the photovoltaic cell) located at the lowest point of the heat pipe/vapor chamber. This orientation allows gravity to assist the return of the working fluid to the heat source in the vapor chamber. Heat pipes and vapor chambers will also operate well in a horizontal orientation. However, in cases where the heat source is located above the heat sink region of the vapor chamber or heat pipe it is common to see degraded performance.

FIGS. 4A-C are diagrams illustrating how cooling apparatus 103 in a variety of different orientations experiences predominately vertical airflow during operation. Namely, FIGS. 4A-C show cooling apparatus 103 in three elevation angles and how in all three cases at least one portion of the heat exchanger 201 (due to its bent shape) is in a predominantly vertical orientation. As described above, air tends to rise up in a vertical direction. Thus, since the plate fin heat exchanger is a naturally convective heat exchanger (see above), then it is beneficial for at least a portion of the plate fin heat exchanger to be in a substantially vertical orientation during operation to enhance convection of heat from the plate fin heat exchanger to the air.

As is apparent from FIGS. 4A-C, cooling apparatus 103 pivots along an axis 402 (pointing into/out of the page) which permits positioning the concentrating solar collector relative to the changing position of the sun, i.e., horizontal (FIG. 4A), intermediate (FIG. 4B) and vertical (FIG. 4C) positions relative to solar positions A, B and C, respectively.

Namely, in FIG. 4A, the concentrating solar collector attached to cooling apparatus 103 is shown in a horizontal elevation and a significant portion of the heat exchanger 201 is in a predominantly vertical convective air flow. In FIG. 4B, the concentrating solar collector attached to cooling apparatus 103 is shown in an intermediate elevation and again a significant portion of the heat exchanger 201 is in a predominantly vertical convective air flow. In FIG. 4C, the concentrating solar collector attached to cooling apparatus 103 is shown in a vertical elevation and a significant portion of the heat exchanger 201 is once again in a predominantly vertical convective air flow.

FIGS. 4A-C also illustrate how the position of the photovoltaic cell (which is covered by the concentrating solar collector and thus not visible in this depiction) is in all cases located below or at the same level as the heat sink regions of the heat pipe, i.e., the source regions of the heat pipe (areas where heat enters the heat pipe) are lower than the sink regions of the heat pipe (areas where heat exits the heat pipe). By so configuring the cooling system, good performance of both heat exchanger 201 and the vapor chamber 204 is achievable in all elevation angles. The dashed arrows in FIGS. 4A-C are adjacent to the region of the cooling system experiencing substantially vertical air flow and indicate the direction of this convective airflow.

According to an exemplary embodiment, the term "substantially vertical orientation," refers to a deviation from a perfectly vertical position of no more than 45 degrees (with a deviation of 90 degrees being considered a perfectly horizontal orientation). Thus, to illustrate this principle, FIGS. 5A-C (which correspond to the exemplary orientations of the cooling apparatus 103 in FIGS. 4A-C, respectively) show how at least one portion of the cooling apparatus is always in a substantially vertical orientation. For instance, in FIG. 5A (which corresponds to the orientation shown in FIG. 4A), a first portion of the cooling apparatus 103 is in a perfectly vertical position.

In FIG. 5B (which corresponds to the orientation shown in FIG. 4B), both a first portion of the cooling apparatus 103 and a second portion of the cooling apparatus 103 are in a substantially vertical position since the first and second portions of the cooling apparatus deviate from a perfectly vertical position by less than 45 degrees, i.e., $\theta 1$ is less than 45 degrees and $\theta 2$ is less than 45 degrees.

In FIG. 5C (which corresponds to the orientation shown in FIG. 4C), a second portion of the cooling apparatus 103 is in a substantially vertical position since the second portion of the cooling apparatus deviates from a perfectly vertical position by less than 45 degrees, i.e., $\theta 3$ is less than 45 degrees. In the example shown in FIG. 5C, the first portion of the cooling apparatus is in a perfectly horizontal configuration.

FIG. 6 is a diagram illustrating an exemplary two-axis drive system being used in conjunction with a photovoltaic system, such as the photovoltaic system of FIG. 1 that includes a concentrating solar collector with a high power cooling apparatus attached thereto. As shown in FIG. 6, the photovoltaic system is mounted to a pedestal. The pedestal can be rotated along a first axis, as indicated by arrows 602. The photovoltaic system is mounted to the pedestal by way of a pivot 604 that permits the photovoltaic system to rotate along a second axis, as indicated by arrows 606. Thus, using this mounting configuration, the photovoltaic system can be pointed in two dimensions to follow movement of the sun. By way of example only, rotating the photovoltaic system along the first axis (see arrows 602) allows for setting the azimuth angle (i.e., the position of the sun in the sky relative to a reference vector), and rotating the photovoltaic system along the second axis (see arrows 606) allows for setting the elevation. The concepts of azimuth and elevation would be apparent to one of skill in the art and thus are not described further herein. Additionally, it is to be understood that the two-axis system drive system shown in FIG. 6 is merely exemplary, and any other suitable two-axis system that permits both azimuth and elevation adjustments may be similarly employed.

According to an exemplary embodiment, the two-axis drive system shown in FIG. 6 is equipped with motorized actuators (not shown) to permit automated (e.g., remote, computer-controlled) adjustment of the azimuth and elevation positioning. The process for implementing such motorized actuators in accordance with the present teachings would be apparent to one of ordinary skill in the art and thus is not described further herein.

FIG. 7 is a diagram illustrating an enlarged view 702 of a portion of the present plate fin heat exchanger (such as heat exchanger 201 of FIG. 2) that highlights the plate and fins attached thereto as well as an optional wrapper 704 that caps the fins. As shown in FIG. 7, the wrapper is configured to be open at the top and bottom of each fin so as to permit the formation of a convective airflow along the channel containing the fins. This open end wrapper configuration enhances the flow of air past the fins and improves the cooling capacity of the system in areas where wind is not usually present. According to an exemplary embodiment, the wrapper is made of a metal or plastic material, such as aluminum, steel, acrylic, or other suitable sheet material that can be bent or formed around the fins as shown and affixed to the assembly. The function of the wrapper is similar to a chimney in that the buoyancy of air in the more vertical portions of the heat exchanger pulls the air through the more horizontal portions of the heat exchanger. Thus the purpose of the wrapper is simply to constrain the air flow along the length of the fins.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An apparatus for cooling a photovoltaic cell, comprising:
a heat exchanger comprising a metal plate with a bend therein that positions a first surface of the metal plate at an angle of about 100 degrees to about 150 degrees relative to a second surface of the metal plate, and a plurality of fins attached to a side of the metal plate opposite the first surface and the second surface, wherein each of the plurality of fins extends along an entire length of the side and crosses the bend;
a vapor chamber extending along the first surface and the second surface of the metal plate, crossing the bend, such that during operation when the photovoltaic cell is attached to either the first surface or the second surface of the metal plate the vapor chamber is positioned to transport heat away from the photovoltaic cell, wherein the vapor chamber is at least partially embedded in the metal plate;
a cladding material between the vapor chamber and the heat exchanger, wherein the cladding material is configured to thermally couple the vapor chamber to the heat exchanger; and
a thermal spreader plate at either the first surface or the second surface of the metal plate, wherein the thermal spreader plate is attached to, and in direct physical contact with, the vapor chamber, and wherein during operation the photovoltaic cell is positioned on the thermal spreader plate over the vapor chamber in a manner so as to be electrically isolated from the metal plate by the cladding material.

2. The apparatus of claim 1, wherein the bend positions the first surface of the metal plate at an angle of about 140 degrees relative to the second surface of the metal plate.

3. The apparatus of claim 1, wherein the heat exchanger is a naturally convective heat exchanger.

4. The apparatus of claim 1, wherein the cladding material is configured to electrically isolate the vapor chamber from the heat exchanger.

5. The apparatus of claim 1, wherein the cladding material comprises one or more of plastic, ceramic and glass.

6. The apparatus of claim 1, wherein the vapor chamber comprises a heat pipe.

7. The apparatus of claim 1, further comprising a wrapper around the fins that is open at a top and a bottom to allow airflow along the fins, wherein the wrapper is formed of a metal or plastic material that is formed around the fins and affixed to the heat exchanger.

8. A photovoltaic system, comprising:
a cooling apparatus, comprising:
a heat exchanger comprising a metal plate with a bend therein that positions a first surface of the metal plate at an angle of about 100 degrees to about 150 degrees relative to a second surface of the metal plate, and a plurality of fins attached to a side of the metal plate opposite the first surface and the second surface, wherein each of the plurality of fins extends along an entire length of the side and crosses the bend;
a vapor chamber extending along the first surface and the second surface of the metal plate, crossing the bend, wherein the vapor chamber is at least partially embedded in the metal plate;
a cladding material between the vapor chamber and the heat exchanger, wherein the cladding material is configured to thermally couple the vapor chamber to the heat exchanger;
a thermal spreader plate at either the first surface or the second surface of the metal plate, wherein the thermal spreader plate is attached to, and in direct physical contact with, the vapor chamber;
at least one photovoltaic cell thermally coupled to the vapor chamber, wherein the photovoltaic cell is positioned on the thermal spreader plate over the vapor chamber in a manner so as to be electrically isolated from the metal plate by the cladding material; and
a concentrating solar collector attached to either the first surface or the second surface of the metal plate and surrounding the photovoltaic cell.

9. The photovoltaic system of claim 8, further comprising:
a thermal interface material between the thermal spreader plate and the photovoltaic cell.

10. The photovoltaic system of claim 9, wherein the thermal interface material comprises one or more of a solder, a liquid metal thermal interface, a liquid metal alloy, thermal grease, a conductive particle filled organic thermal paste, a conductive particle filled organic thermal gel, a particle impregnated polymer and a phase change material.

11. The photovoltaic system of claim 8, wherein the cladding material is configured to electrically isolate the vapor chamber from the heat exchanger.

12. The photovoltaic system of claim 8, wherein the bend positions the first surface of the metal plate at an angle of about 140 degrees relative to the second surface of the metal plate.

13. A method for operating a photovoltaic system, comprising the steps of:
providing the photovoltaic system comprising:
a cooling apparatus having a heat exchanger comprising a metal plate with a bend therein that positions a first surface of the metal plate at an angle of from about 100 degrees to about 150 degrees relative to a second surface of the metal plate, and a plurality of fins attached to a side of the metal plate opposite the first surface and the second surface, wherein each of the plurality of fins extends along an entire length of the side and crosses the bend, a vapor chamber extending along the first surface and the second surface of the metal plate, crossing the bend, wherein the vapor chamber is at least partially embedded in the metal plate, a cladding material between the vapor chamber and the heat exchanger, wherein the cladding material is configured to thermally couple the vapor chamber to the heat exchanger, and a thermal spreader plate at either the first surface or the second surface of the metal plate, wherein the thermal spreader plate is attached to, and in direct physical contact with, the vapor chamber;
at least one photovoltaic cell thermally coupled to the vapor chamber, wherein the photovoltaic cell is positioned on the thermal spreader plate over the vapor chamber in a manner so as to be electrically isolated from the metal plate by the cladding material;
a concentrating solar collector attached to either the first surface or the second surface of the metal plate and surrounding the photovoltaic cell; and
rotating the photovoltaic system to place the photovoltaic cell at a plurality of positions relative to a light source.

14. The method of claim 13, wherein the system further comprises:

a thermal interface material between the thermal spreader plate and the photovoltaic cell.

* * * * *